(12) United States Patent
Krajec et al.

(10) Patent No.: US 6,384,617 B1
(45) Date of Patent: May 7, 2002

(54) SIGNAL TRANSFER DEVICE FOR PROBE TEST FIXTURE

(75) Inventors: Russell S. Krajec, Berthould; Wallace Joseph Lannen, Fort Collins, both of CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/441,473

(22) Filed: Nov. 17, 1999

(51) Int. Cl.[7] ............................................. G01R 31/02
(52) U.S. Cl. ..................... 324/755; 324/754; 324/158.1
(58) Field of Search ................... 324/758, 620, 324/782, 158.1, 761, 762, 754

(56) References Cited

U.S. PATENT DOCUMENTS

| | | | |
|---|---|---|---|
| 4,365,195 A | 12/1982 | Stegens | 324/158 |
| 4,505,034 A | 3/1985 | Reidt | 29/749 |
| 4,686,463 A | 8/1987 | Logan | 324/158 |
| 4,707,656 A | 11/1987 | Marzan | 324/158 |
| 4,808,919 A | 2/1989 | Sylviane et al. | 324/158 |
| 4,866,375 A * | 9/1989 | Malloy | 324/158.1 |
| 4,939,454 A | 7/1990 | Miner | 324/158 |
| 4,961,050 A | 10/1990 | Harwood et al. | 324/158 |
| 5,017,865 A | 5/1991 | Oldfield | 324/158 |
| 5,153,505 A * | 10/1992 | Abita et al. | 324/158.1 |
| 5,252,916 A * | 10/1993 | Swart | 324/158.1 |
| 5,300,881 A | 4/1994 | Ferrer et al. | 324/158 |
| 5,321,351 A | 6/1994 | Swart et al. | 324/158 |
| 5,408,189 A | 4/1995 | Swart et al. | 324/758 |
| 5,416,405 A | 5/1995 | Dill | 324/72.5 |
| 5,436,567 A | 7/1995 | Wexler et al. | 324/754 |
| 5,492,223 A | 2/1996 | Boardman et al. | 206/710 |
| 5,506,513 A | 4/1996 | Bacher | 324/755 |
| 5,572,144 A | 11/1996 | Davidson et al. | 324/755 |
| 5,575,076 A * | 11/1996 | Creeden | 33/620 |
| 5,629,838 A * | 5/1997 | Knight et al. | 361/782 |
| 5,715,167 A | 2/1998 | Gupta et al. | 364/474.28 |
| 5,923,181 A * | 7/1999 | Beilstein, Jr. et al. | 324/758 |
| 6,005,405 A * | 12/1999 | Slutz | 324/761 |
| 6,043,669 A * | 3/2000 | Carroll | 324/761 |
| 6,066,957 A * | 5/2000 | Van Loan et al. | 324/758 |

* cited by examiner

*Primary Examiner*—Safet Metjahic
*Assistant Examiner*—Jimmy Nguyen

(57) ABSTRACT

A signal transfer device for transferring an electrical signal from a test fixture such as a printed circuit board to a device under test. The signal transfer device is mounted beneath a probe plate and includes a spring-loaded transfer element for contacting a test pad on the test fixture. Through contact by the transfer element, an electrical signal is transferred from the test pad to a probe receptacle in the probe plate, which is wire wrapped to another probe receptacle in the probe plate for use in providing the electrical signal to the device under test.

20 Claims, 2 Drawing Sheets

SIGNAL TRANSFER DEVICE FOR PROBE TEST FIXTURE

REFERENCE TO RELATED APPLICATION

The present application is related to United States patent application of Russell S. Krajec, filed on even date herewith, and entitled "Adjustable Electrical Connector for Test Fixture Nest," which is incorporated herein by reference as if fully set forth.

FIELD OF THE INVENTION

The present invention relates to a device for transferring electrical signals from a signal connection to a test fixture.

BACKGROUND OF THE INVENTION

Certain devices are more easily tested and worked on while held securely in position. For example, when performing maintenance on cellular telephones, a person more easily may work with the telephone if it is held securely in position. In addition, holding the device under test in position serves to protect it from potential damage while being worked on. Also, certain types of test apparatus require that the device under test be securely held in position in order to connect the test apparatus to it. For certain applications, a nest plate may be custom-made to securely hold a particular device under test. In order to customize a nest plate, the device under test is measured, and appropriate configuration and machining is made of the nest plate to accommodate the device under test with a mechanism to securely hold it in place, such as nest pins located in predetermined locations.

In addition, a device under test sometimes requires electrical connection for testing. Therefore, in addition to securely holding the device under test in position, a mechanism must be provided for permitting electrical connection to the device under test. Moreover, certain devices require that they be elevated above a nest plate such as for providing electrical connection to contacts on their underside. Therefore, the nest plate sometimes must include a custom-made mechanism for raising a device under test above the nest plate. Also, some devices under test require connection with a printed circuit board (PCB) for testing, and others require shielding from radio frequency (RF) electromagnetic energy. Additional apparatus must be provided in those situations for the connection or RF shielding.

Certain devices under test may have electrical probes in standard or preconfigured locations. For testing, the probes are attached to a particular PCB. Therefore, a mechanism must be provided for connecting the probes to the PCB for transferring electrical signals for the testing, such as for performing diagnostic testing on cellular telephones. That mechanism typically includes a cable with clips connected between the PCB and the probes.

Accordingly, a need exists for an improved method of transferring electrical signals between a device under test and a test fixture providing or receiving electrical signals.

SUMMARY OF THE INVENTION

A signal transfer device consistent with the present invention may be used to transfer an electrical signal between a test fixture and a probe plate. The signal transfer device includes a base connected to a leg portion. The leg portion has an end including an aperture for receiving a fastener and for mating with the probe plate when connected to the probe plate by the fastener. The base includes a transfer element having a first end for contacting a signal connection of the test fixture and having a second end for contacting a probe receptacle, the transfer element transferring an electrical signal between the signal connection and the probe receptacle.

A test fixture assembly consistent with the present invention uses a signal transfer device for transferring an electrical signal between a test fixture and a probe plate. The test fixture assembly includes a test fixture having a signal connection for providing an electrical signal and a probe plate having a probe receptacle. It also includes a signal transfer device for transferring the electrical signal between the test fixture and the probe receptacle in the probe plate. The signal transfer device includes a base connected to a leg portion. The leg portion has an end including an aperture for receiving a fastener and for mating with the probe plate when connected to the probe plate by the fastener. The base includes a transfer element having a first end for contacting the signal connection of the test fixture and having a second end for contacting the probe receptacle, the transfer element transferring an electrical signal between the signal connection and the probe receptacle.

A method consistent with the present invention may be used to transfer an electrical signal between a test fixture and a probe plate. Under the method, a test fixture is provided including a signal connection for providing an electrical signal, and a probe plate is provided having a probe receptacle. A signal transfer device, having a base connected to a leg portion, is attached to the probe plate adjacent the probe receptacle, and included within the base of the signal transfer device is a transfer element having a first end extending from a first side of the base and having a second end extending from a second side of the base. An orientation of the transfer element in the base is configured such that, when the signal transfer device is attached to the probe plate and the base is placed against the signal connection, the transfer element forms an electrical connection between the signal connection and the probe receptacle.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Figure 1:
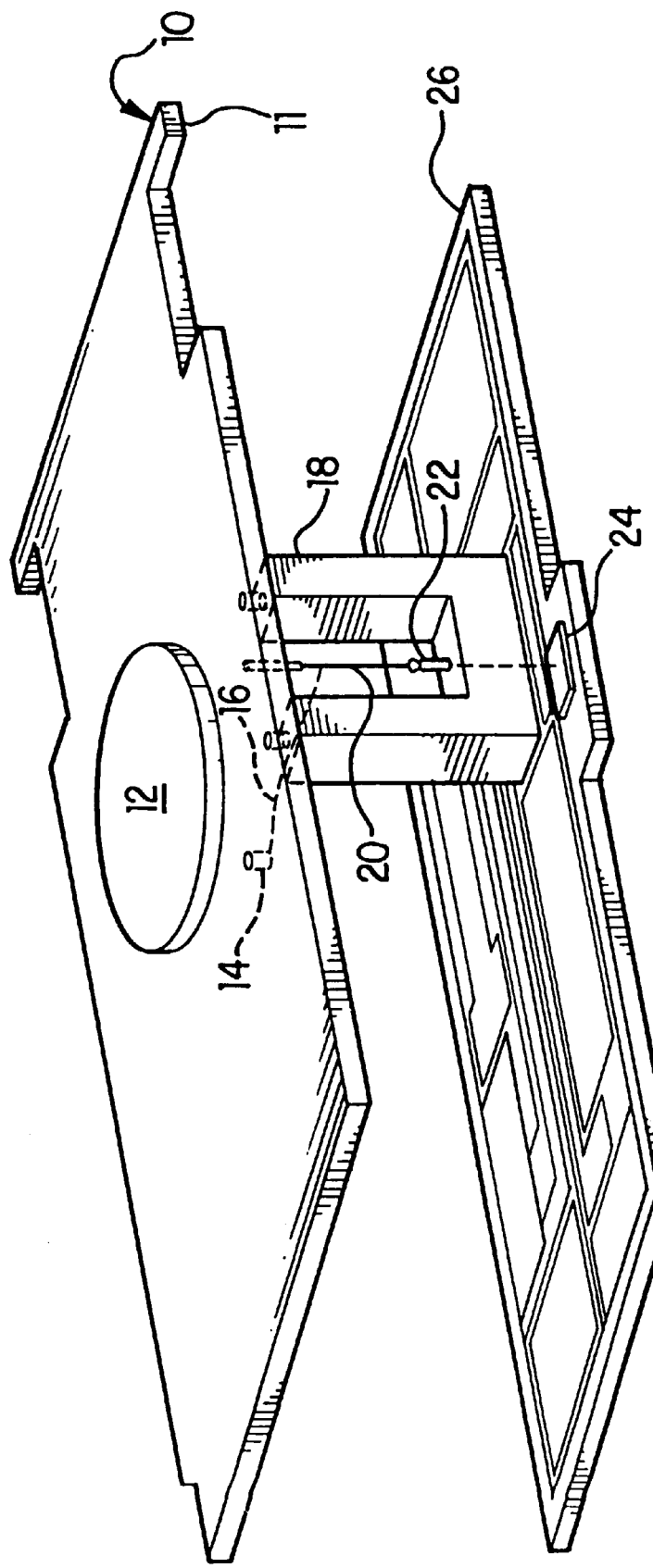
FIG. 1 is a perspective diagram of a test fixture assembly including a signal transfer device along with a probe plate and a test fixture.

FIG. 1 is a diagram of a test fixture assembly including a signal transfer device 18 for transferring electrical signals between a probe plate 10 and a test fixture 26 such as a PCB. Test fixture 26 includes test pads such as test pad 24, typically in standard locations and providing contacts for electrical connections. Signal transfer device 18 provides for transfer of an electrical signal, using a transfer element 22, between test pad 24 or other signal connection and a probe receptacle 20 located within probe plate 10. Probe receptacle 20 is typically wire wrapped and electrically connected with another probe receptacle 14 within probe plate 10 using a wire 16. Probe receptacle 14 thus provides for connection with a device under test 12 to provide the electrical signal transferred to or from test fixture 26 for testing device 12. Probe receptacles 14 and 20 may be implemented with any conductive element for providing an electrical signal such as a metal cylinder for receiving a probe. Although only one is shown for illustrative purposes, probe plate 10 may include multiple signal transfer devices 18 for transferring electrical signals between various test pads on test fixture device 26 and multiple probe receptacles 14 in probe plate 10.

The location of probe receptacle 14, and other such probe receptacles for transferring signals from test fixture 26, may depend upon a configuration of device 12. Those locations may be customized for particular devices to be tested. For example, device 12 may have probe pins in standard or preconfigured locations, and the locations of multiple probe receptacles 14 in probe plate 10 may be configured so that the probe pins on device 12 can mate with the multiple probe receptacles 14. Signal transfer device 18 thus facilitates testing the same or different devices 12 having a same pin configuration by easily removing one device 12 from multiple probe receptacles 14 in probe plate 10 and mating another device 12 with the same configuration of multiple probe receptacles 14.

Likewise, test fixture 26, if implemented as a PCB, typically has multiple test pads 24 in standard or preconfigured locations. With multiple signal transfer devices 18 positioned on probe plate 10 for those standard or preconfigured locations, different PCBs may be used with the same configuration of multiple signal transfer devices 18 on probe plate 10. Signal transfer device 18 thus facilitates testing device 12 with different test fixtures 26 by easily removing from one test fixture 26 probe plate 10 with multiple signal transfer devices 18 attached and placing it against another test fixture 26 having test pads 24 in the same locations.

Therefore, signal transfer device 18 provides a low cost and easily configurable mechanism for transferring electrical signals to or from a test fixture to any device under test on a probe plate for testing or other purposes. Examples of uses include, but are not limited to, testing any PCB, bare board testing, in-circuit testing, and testing assembled devices such as cellular telephone system connectors or battery connections. Signal transfer device 18 may be used to transfer any type of electrical signal. Examples of such signals include, but are not limited to, analog, digital, high frequency, low frequency, and power signals. Furthermore, signal transfer device 18 may be used in any type of environment requiring transfer of signals for testing or other purposes. Examples of such environments include, but are not limited to, a research and development laboratory, a production assembly facility, a service depot, and a point of sale tester.

Accordingly, use of signal transfer device 18 obviates a need for a standard configuration of probes, or a need to construct and install a cable between a test fixture and probe plate for testing. For example, it obviates a need to attach cables with clips between test fixture 26 and probe plate 10 or each device 12 to be tested. Certain uses of signal transfer device 18 also provide for a direct connection between a probe receptacle and a test fixture PCB in order to avoid potentially adverse effects of resistance and impedance caused by several connections of cable that otherwise may be used for signal transfer. Signal transfer device 18 with probe plate 10 also provides an elevated stable base for testing device 12.

Figure 3:
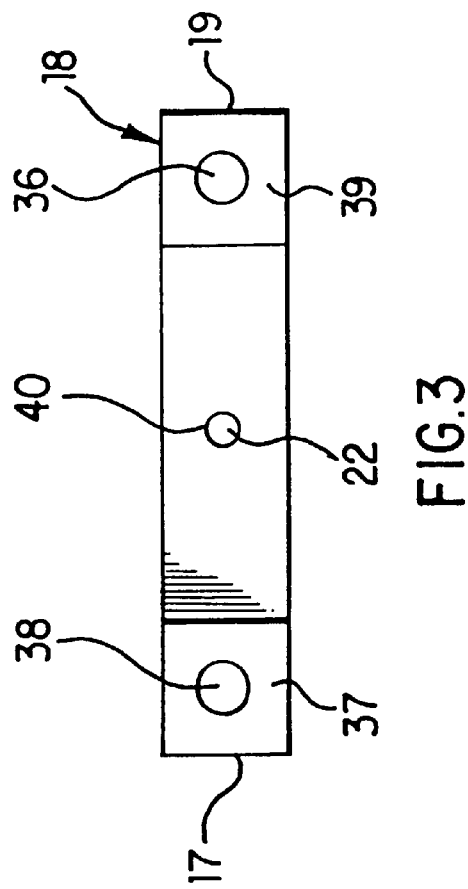
FIG. 3 is a top view of the signal transfer device shown in FIGS. 1 and 2.
Figure 2:
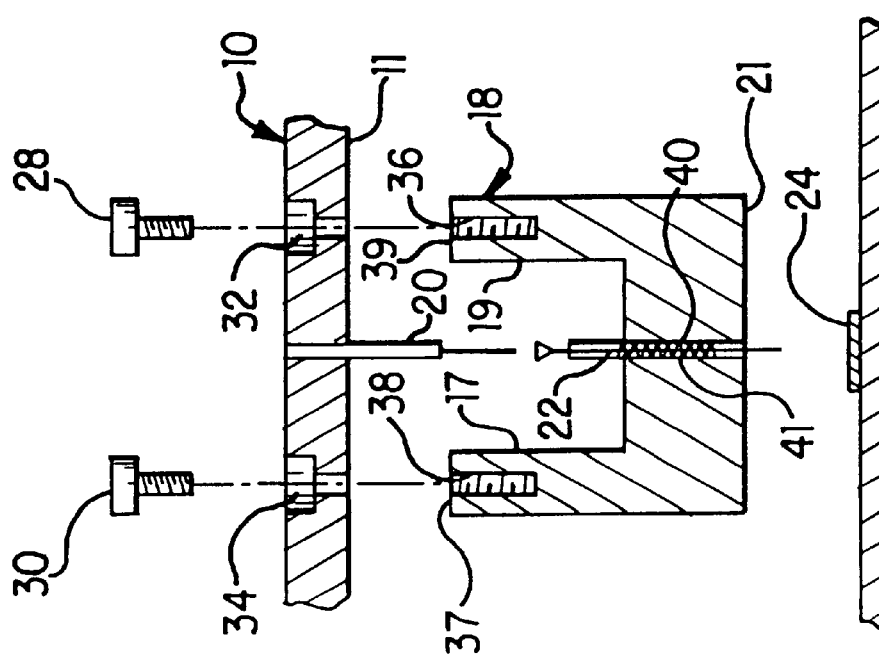
FIG. 2 is an exploded side view of the transfer signal device shown in FIG. 1.

FIG. 2 is an exploded side view of signal transfer device 18 with probe plate 10 and test fixture 26, and FIG. 3 is a top view of signal transfer device 18. As shown in FIG. 2, signal transfer device 18 has a base 21 and a leg portion, shown in this example as legs 17 and 19, although the leg portion may alternatively only include one leg 17 or 19. Base 21 with legs 17 and 19 form, for example, a U-shape as shown, and they may be integrally formed from one piece of a material, or formed from multiple pieces of material joined together. In order to insulate transfer element 22, base 21 along with legs 17 and 19 may be implemented with a non-conductive material such as a molded non-conductive plastic, a machined non-conductive plastic, or a fiberglass reinforced epoxy laminate. Probe plate 10 may be implemented with any non-conductive material such as, for example, fiberglass reinforced laminate sold under the name "G10."

Signal transfer device 18 may be implemented with configurations other than the U-shape shown in FIG. 2. For example, although legs 17 and 19 are shown as extending from base 21 at right angles, they may extend at different angles for mating with probe plate 10, and more or fewer legs may be used to secure signal transfer device 18 to probe plate 10. Also, although base 21 is shown as having a rectangular shape, as shown in FIG. 3, it may be implemented with other shapes. For example, base 21 may have an L-shape, when viewed from a top view, in order to provide signal transfer from a test pad located in a corner of test fixture 26.

As shown in FIG. 2, signal transfer device 18 is mounted to probe plate 10 using fasteners 28 and 30. Probe plate 10 includes apertures 32 and 34 for receiving fasteners 28 and 30, respectively. As shown in FIGS. 2 and 3, leg 17 includes an end surface 37 and a threaded aperture 38, and leg 19 includes an end surface 39 and a threaded aperture 36. Fasteners 28 and 30 are secured to threaded apertures 36 and 38, respectively, through apertures 32 and 34 in probe plate 10. Fasteners 28 and 30 may be implemented with screws, compatible with an Allen wrench or other tool for securing them. Alternatively, non-threaded fasteners may be used, although use of screws provides for easy removal and relocation of signal transfer device 18 if necessary or desired. As shown in FIGS. 1 and 2, apertures 32 and 34 may be configured so that fasteners 28 and 30 lie flush with the top of probe plate 10 when secured in threaded apertures 36 and 38. Alternatively, apertures 32 and 34 may be configured so that fasteners 28 and 30 project above or are recessed within the top of probe plate 10 when secured in position.

As shown in FIGS. 1 and 2, upon securing fasteners 28 and 30 to legs 17 and 19, end surfaces 37 and 39 are mated against a bottom surface 11 of probe plate 10 in order to hold signal transfer device 18 in position beneath probe plate 10. Probe plate 10 may include many threaded apertures for positioning signal transfer device 18, and possibly other such signal transfer devices, at appropriate locations for transferring signals from test pad 24 or other test pads. Therefore, signal transfer device 18 may be easily located at or moved between various locations for transferring signals to receptacles in probe plate 10.

As shown in FIGS. 2 and 3, signal transfer device 18 also includes an aperture 40 for locating a spring-loaded transfer element 22. Transfer element 22 is typically spring loaded on both ends of it, using a spring 41 as shown in FIG. 2, for movement both towards and away from probe plate 10. Transfer element 22 may be implemented with any type of conductive element such as a metal pin, and it may optionally be used without spring loading. Spring 41 provides force to assist in maintaining transfer element 22 in contact with test pad 24 and probe receptacle 20 while in use when signal transfer device 18 is attached to probe plate 10.

In use, transfer element 22 contacts and blindly mates with test pad 24 or other signal connection upon positioning of signal transfer device 18 over test pad 24. Transfer element 22 also contacts probe receptacle 20 when signal transfer device 18 is in use. Thus, with transfer element 22 contacting test pad 24 and probe receptacle 20 and maintained in contact with them through the spring loading provided by spring 41, transfer element 22 transfers electrical signals between test pad 24 and wire-wrapped probe receptacle 20. Probe receptacle 20 in turn transfers the signal through wire 16 to or from probe receptacle 14 for use with device under test 12, as shown in FIG. 1. Device 12 typically has probe pins that mate with one or more probe receptacles 14 for testing or other purposes. Although probe receptacles 14 and 20 are shown as a receptacle for mating with a probe pin, probe receptacles 14 and 20 may alternatively be implemented with pins located in probe plate 10 for mating with probe receptacles in device 12.

Signal transfer device 18 may also be used in a method of transferring an electrical signal between test fixture 26 and probe plate 10, as illustrated in FIGS. 1 and 2. In the exemplary method, test fixture 26 is provided including test pad 24 or other signal connection for providing an electrical signal, and probe plate 10 is provided having probe receptacle 20. Signal transfer device 18, having base 21 connected to a leg portion such as legs 17 and 19, is attached to probe plate 10 adjacent probe receptacle 20. Included within base 21 of signal transfer device 18 is transfer element 22 having a first end extending from a first side of base 21 and having a second end extending from a second side of base 21. An orientation of transfer element 22 in base 21 is configured such that, when signal transfer device 18 is attached to probe plate 10 and base 21 is placed against test pad 24 or other signal connection, transfer element 22 forms an electrical connection between test pad 24 and probe receptacle 20. The exemplary method may also include providing spring-loading of transfer element 22 in base 21 using spring 41, and providing probe receptacle 14 in probe plate 10 and electrically connected with probe receptacle 20 using wire 16.

While the present invention has been described in connection with an exemplary embodiment, it will be understood that many modifications will be readily apparent to those skilled in the art, and this application is intended to cover any adaptations or variations thereof. For example, different labels for the various components, types of materials, and configurations may be used without departing from the scope of the invention. This invention should be limited only by the claims and equivalents thereof.

What is claimed is:

1. A repositionable signal transfer device for use in transferring an electrical signal between a test fixture and a probe plate, comprising:
   a base connected to a leg portion;
   the leg portion having an end including an aperture for receiving a fastener and for repositionably mating with the probe plate when connected to the probe plate by the fastener; and
   the base including a transfer element having a first end for removably contacting a signal connection of a test fixture and having a second end for contacting a probe receptacle, the transfer element transferring an electrical signal between the signal connection and the probe receptacle,
   wherein multiple signal transfer devices can be positioned on the probe plate to adapt test fixtures with multiple probe receptacles in varying locations, and wherein the multiple signal transfer devices can be removed from the test fixture without disassembling the probe plate.

2. The signal transfer device of claim 1 wherein the transfer element is spring loaded in the base.

3. The signal transfer device of claim 1 wherein the transfer element includes a metal pin.

4. The signal transfer device of claim 1 wherein the leg portion includes a threaded aperture for receiving the fastener.

5. The signal transfer device of claim 1 wherein the leg portion includes first and second legs connected to the base, each of the first and second legs having an aperture for receiving a fastener.

6. The signal transfer device of claim 4 wherein the base and the first and second legs form a U-shaped configuration.

7. The signal transfer device of claim 1 wherein the base and the leg portion are integrally formed from one piece of a material.

8. The signal transfer device of claim 1 wherein the base and the leg portion are formed from a non-conductive material.

9. A reconfigurable test fixture assembly using a repositionable signal transfer device for use in transferring an electrical signal between a test fixture and a probe plate, comprising:
   a test fixture including a signal a probe plate having a probe receptacle; and
   a repositionable signal transfer device for transferring the electrical signal between the test fixture and the probe receptacle in the probe plate, the repositionable signal transfer device including:
   a base connected to a leg portion;
   the leg portion having an end including an aperture for receiving a fastener and for repositionably mating with the probe plate when connected to the probe plate by the fastener; and
   the base including a transfer element having a first end for removably contacting a signal connection of a test fixture and having a second end for contacting a probe receptacle, the transfer element transferring an electrical signal between the signal connection and the probe receptacle,
   wherein multiple signal transfer devices can be positioned on the probe plate to adapt test fixtures with multiple probe receptacles in varying locations, and wherein the multiple signal transfer devices can be removed from the test fixture without disassembling the probe plate.

10. The test fixture assembly of claim 9, further including a receptacle located in the probe plate and electrically connected with the probe receptacle.

11. The test fixture assembly of claim 9 wherein the transfer element is spring loaded in the base.

12. The test fixture assembly of claim 9 wherein the transfer element includes a metal pin.

13. The test fixture assembly of claim 9 wherein the leg portion includes a threaded aperture for receiving the fastener.

14. The test fixture assembly of claim 9 wherein the leg portion includes first and second legs connected to the base, each of the first and second legs having an aperture for receiving a fastener.

15. The test fixture assembly of claim 14 wherein the base and the first and second legs form a U-shaped configuration.

16. The test fixture assembly of claim 9 wherein the base and the leg portion are integrally formed from one piece of a material.

17. The test fixture assembly of claim 9 wherein the base and the leg portion are formed from a non-conductive material.

18. A method for transferring an electrical signal between a test fixture and a probe plate, comprising:

providing a test fixture including a plurality of signal connections for providing an electrical signal;

providing a probe plate having a plurality of probe receptacles;

repositionably attaching a plurality of signal transfer devices, having a base connected to a leg portion, to the probe plate adjacent the probe receptacles;

including within the base of the signal transfer devices a transfer element having a first end extending from a first side of the base and having a second end extending from a second side of the base; and configuring an orientation of the transfer element in the base such that, when the plurality of signal transfer devices are attached to the probe plate and the base is placed against the signal connection, the transfer element forms a removable electrical connection between the signal connections and the probe receptacles.

19. The method of claim 18 wherein the configuring step includes providing spring-loading of the transfer element in the base.

20. The method of claim 18, further including providing a receptacle in the probe plate and electrically connected with the probe receptacle.

* * * * *